US006567339B2

(12) United States Patent

Bando

(10) Patent No.: US 6,567,339 B2

(45) Date of Patent: May 20, 2003

(54) SEMICONDUCTOR INTEGRATED CIRCUIT

(75) Inventor: Yoshihide Bando, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/036,392

(22) Filed: Jan. 7, 2002

(65) Prior Publication Data

US 2002/0145930 A1 Oct. 10, 2002

(30) Foreign Application Priority Data

Apr. 5, 2001 (JP) ....................................... 2001-107300

(51) Int. Cl.$^{7}$ .................................................. G11C 8/00

(52) U.S. Cl. .................................... 365/233; 365/233.5

(58) Field of Search ............................... 365/233, 233.5

(56) References Cited

U.S. PATENT DOCUMENTS 5,629,897 A * 5/1997 Iwamoto et al. ............ 365/195

* cited by examiner

*Primary Examiner*—M. Tran

(74) *Attorney, Agent, or Firm*—Arent Fox Kintner Plotkin & Kahn, PLLC

(57) ABSTRACT

An external command receiving circuit receives an external command signal supplied from the exterior, in synchronization with one transition edge of a first clock signal. An internal command receiving circuit receives an internal command signal internally generated, in synchronization with the other transition edge of the first clock signal. Namely, receiving operation of the internal command signal by the internal command receiving circuit shifts from that of the external command signal by the external command receiving circuit by at least a half cycle of the first clock signal. Immediately after starting an operation according to the external command signal, a control circuit for operating an internal circuit does not receive an operation request according to the internal command signal. This can prevent conflict in operation between the internal circuit according to the external command signal and the internal circuit according to the internal command signal, and also prevent malfunction.

12 Claims, 7 Drawing Sheets

SEMICONDUCTOR INTEGRATED CIRCUIT

BACKGROUND OF THE INVENTION

1. Field of the Invention

The present invention relates to a semiconductor integrated circuit which operates an internal circuit according to an external command supplied from the exterior of the semiconductor integrated circuit and an internal command generated in its interior, and more particularly, to a semiconductor integrated circuit including volatile memory cells.

2. Description of the Related Art

The semiconductor integrated circuit such as DRAM holds data in capacitors formed in the memory cells. Since the data written in the memory cells is gradually lost, refresh operation for rewriting the data at predetermined intervals is necessary. There has been recently proposed DRAM which internally generates a refresh request not only during a standby period but also during an operating period and automatically performs the refresh operation according to the request.

FIG. 1 shows the operation of the DRAM like the above. The DRAM receives the external command for performing read operation RD or write operation WR, thereby operating the internal circuit (memory array). In order to prevent a malfunction of the internal circuit, reception of the internal command (refresh command) is inhibited from the supply of the external command to the completion of the operation RD or WR of the internal circuit (inhibition period). The DRAM generates the internal command during a permission period except for the inhibition period, to perform refresh operation REF (FIG. 1(*a*)). Namely, the DRAM is automatically able to perform the refresh operation when the read operation RD and the write operation WR of the memory array 22 are not performed. As a result of this, it is not necessary for a system, to which the DRAM is mounted, to generate the refresh request during the operating period as well as the standby period of the DRAM.

However, the inhibition period of the internal command is set after the received external command is decided to be correct. Hence, there occurs a deviation T1 of a few ns from the reception of the external command until the inhibition of reception of the internal command. In the case where the refresh command is generated during the period T1 (FIG. 1(*b*)), the external command conflicts with the internal command, which results in the malfunction (duplicate operation) of the memory array 22. As a result of this, the data held in the memory cells is destroyed.

The aforesaid disadvantage is caused in a semiconductor integrated circuit of a clock synchronous type such as SDRAM, not only in the DRAM operating asynchronously to the clock. Further, the aforesaid disadvantage is not a phenomenon which occurs only in the semiconductor memory. For example, in the case where an internal circuit of a logic LSI such as CPU operates according to a control command from the exterior and the internal circuit operates according to an interruption command which is generated in its interior, the CPU malfunctions when the control command conflicts with the interruption command.

SUMMARY OF THE INVENTION

It is an object of the present invention to prevent conflict of an external command supplied from the exterior and an internal command internally generated, and to prevent a malfunction of an internal circuit of a semiconductor integrated circuit.

More particularly, it is the object of the present invention to perform refresh operation with reliability in the semiconductor integrated circuit having volatile memory cells.

According to one of the aspects of the semiconductor integrated circuit of the present invention, an external command receiving circuit receives an external command signal supplied from the exterior of the semiconductor integrated circuit, in synchronization with one transition edge of a first clock signal supplied from the exterior. An internal command receiving circuit receives an internal command signal internally generated, in synchronization with the other transition edge of the first clock signal. Namely, receiving operation of the internal command signal by the internal command receiving circuit shifts from receiving operation of the external command signal by the external command receiving circuit by at least a half cycle of the first clock signal. This prevents the conflict in operation between the internal circuit according to the external command signal and the internal circuit according to the internal command signal even when the internal command signal is generated asynchronously to the first clock signal. Namely, it is possible to prevent the malfunction of the internal circuit.

A control circuit does not receive an operation request according to the internal command signal, immediately after starting the operation according to the external command signal. Hence, an operation margin of the control circuit improves, and the control circuit can operate the internal circuit without malfunction according to the external command signal received in the external command receiving circuit or the internal command signal received in the internal command receiving circuit.

According to another aspect of the semiconductor integrated circuit of the present invention, the external command receiving circuit receives the external command signal in synchronization with a rising edge of the first clock signal, and the internal command receiving circuit receives the internal command signal in synchronization with a falling edge of the first clock signal. In the semiconductor integrated circuit, in general, the external command signal is received in synchronization with a rising edge of the clock signal (the first clock signal). Therefore, it is possible to design a receiving circuit of the external command signal in the logic of the conventional art, and to improve its design efficiency.

According to another aspect of the semiconductor integrated circuit of the present invention, the internal command receiving circuit has a phase inverting circuit for inverting the phase of the first clock signal to generate a second clock signal. The internal command signal is received in synchronization with a rising edge of the second clock signal. Therefore, only formation of a simple phase inverting circuit makes it possible to shift receiving timing of the internal command signal from receiving timing of the external command signal (the rising edge of the first clock signal) by a predetermined time.

According to another aspect of the semiconductor integrated circuit of the present invention, the external command receiving circuit receives the external command signal supplied from the exterior of the semiconductor integrated circuit, in synchronization with the first clock signal supplied from the exterior. A clock generator converts the first clock signal to the second clock signal whose phase is different from that of the first clock signal. The internal command receiving circuit receives the internal command signal internally generated, in synchronization with the second clock signal. Namely, the receiving operation of the external command signal by the external command receiving circuit shifts from the receiving operation of the internal command receiving circuit by the internal command receiving circuit by a phase difference between the first clock signal and the second clock signal. This can prevent the conflict in operation between the internal circuit according to the external command signal and the internal circuit according to the internal command signal.

The control circuit does not receive the operation request according to the internal command signal immediately after starting the operation according to the external command signal. Hence, the operation margin of the control circuit improves, and the control circuit can operate the internal circuit without malfunction according to the external command signal received in the external command receiving circuit or the internal command signal received in the internal command receiving circuit.

According to another aspect of the semiconductor integrated circuit of the present invention, the clock generator has a phase inverting circuit for inverting the phase of the first clock signal to generate the second clock signal. Therefore, only formation of a simple phase inverting circuit makes it possible to shift the receiving timing of the external command signal from the receiving timing of the internal command signal.

According to another aspect of the semiconductor integrated circuit of the present invention, the clock generator has a delay circuit for delaying the first clock signal to generate the second clock signal. Therefore, only formation of a simple delay circuit makes it possible to shift the receiving timing of the external command signal from the receiving timing of the internal command signal.

According to another aspect of the semiconductor integrated circuit of the present invention, the control circuit has a decision circuit. The decision circuit decides a first command signal which is received first between the external command signal received in the external command receiving circuit and the internal command signal received in the internal command receiving circuit, and operates the internal circuit according to the first command signal. Since the receiving timing of the external command signal shifts from the receiving timing of the internal command signal, the decision circuit easily decides on which one arrives first. Therefore, the control circuit can securely operate the internal circuit without malfunction.

According to another aspect of the semiconductor integrated circuit of the present invention, the internal circuit has a memory array. The memory array includes volatile memory cells. The external command signal is supplied from the exterior of the semiconductor integrated circuit as a control signal for performing either read operation or write operation of the memory cells. The internal command signal is internally generated as a refresh requesting signal for rewriting data held in the memory cells. Namely, the refresh operation of the memory cells is performed according to the internally generated refresh requesting signal. Since the receiving timing of the external command signal shifts from the receiving timing of the internal command signal, the control circuit does not receive the operation request according to the refresh requesting signal immediately after starting the operation according to the external command signal. This can prevent the read operation, the write operation and the refresh operation being concurrently performed due to the malfunction of the control circuit, and can also prevent destruction of data in the memory cells.

According to another aspect of the semiconductor integrated circuit of the present invention, the semiconductor integrated circuit further has a timer for generating the internal command signal at predetermined intervals. Namely, it is possible to prevent the conflict in operation between the internal circuit according to the external command signal and the internal circuit according to the internal command signal even when the internal command signal is generated asynchronously to the first clock signal.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Hereinafter, the preferred embodiments of the present invention will be explained with reference to the drawings.

Figure 1:
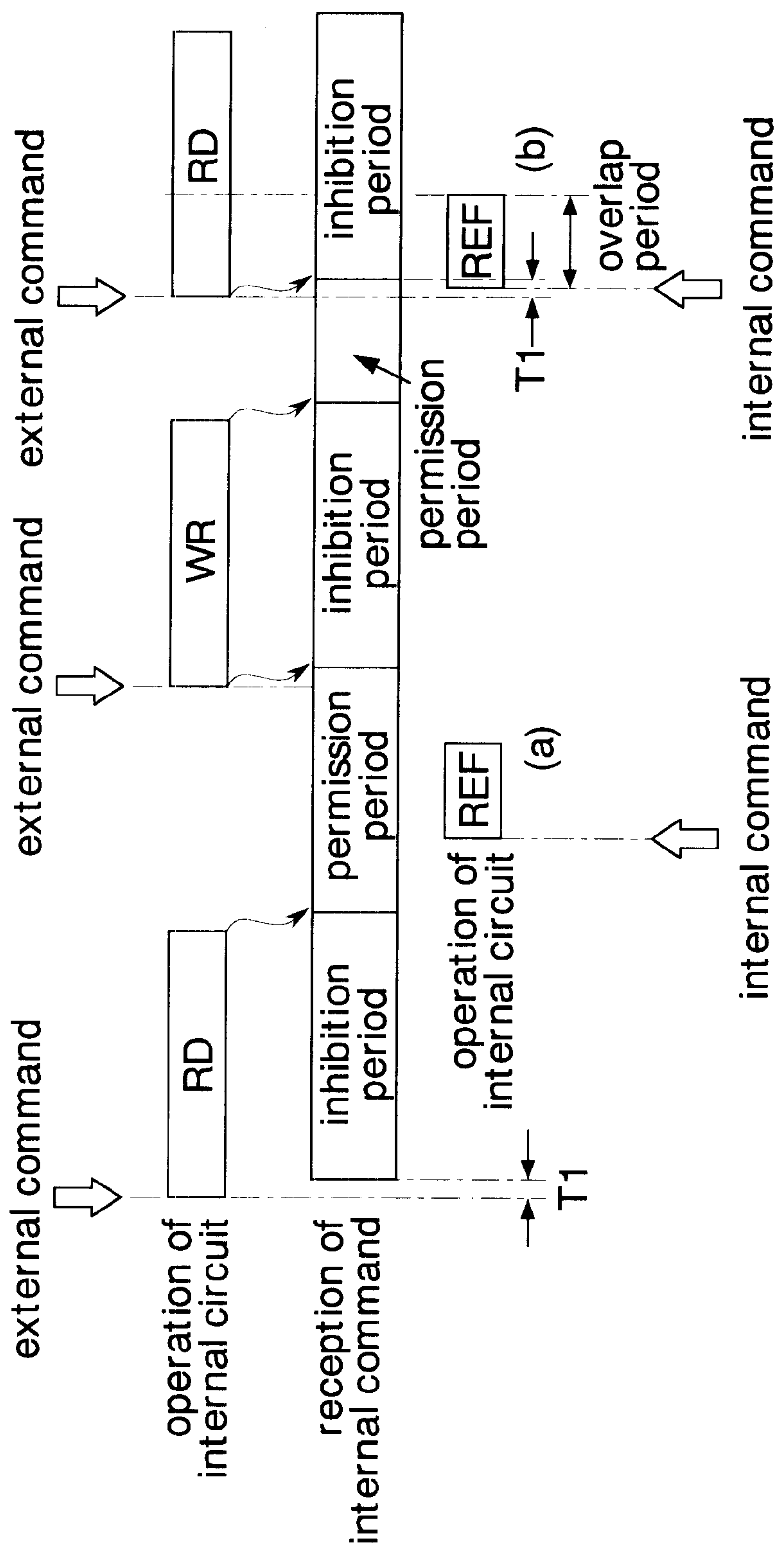
FIG. 1 is a timing chart showing the operation of conventional DRAM.
Figure 2:
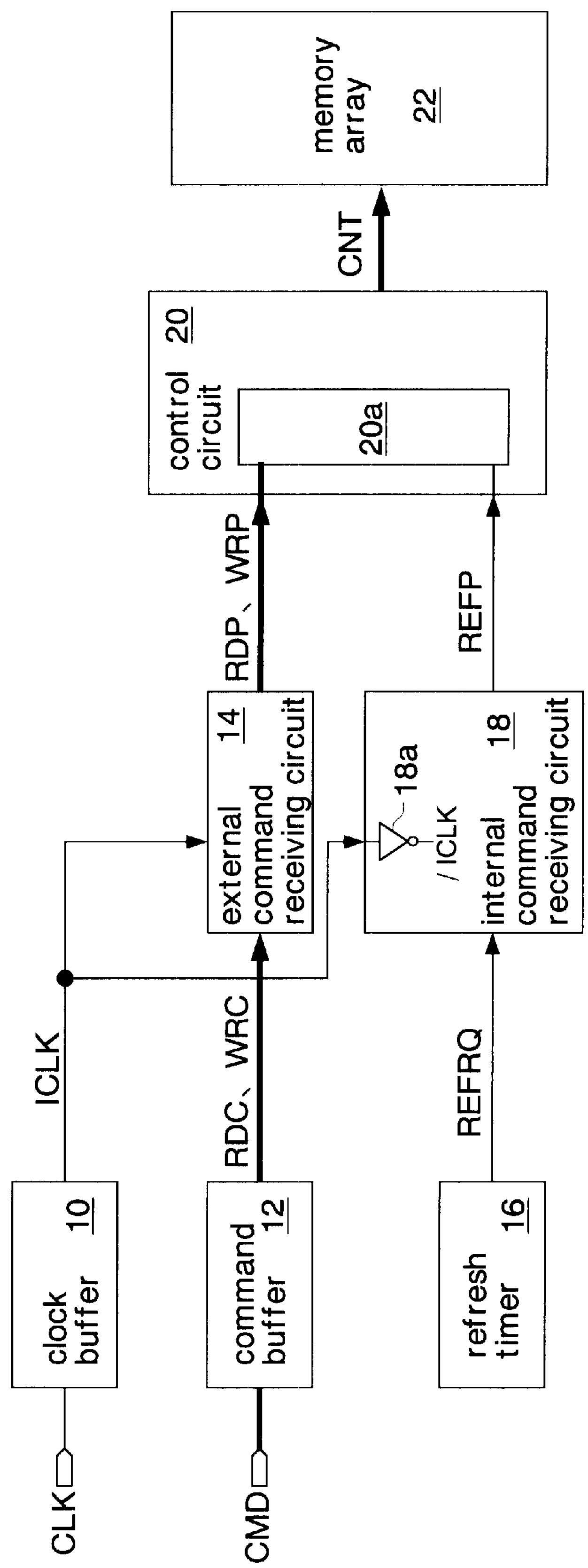
FIG. 2 is a block diagram showing a first embodiment of the semiconductor integrated circuit according to the present invention.

FIG. 2 shows a first embodiment of the semiconductor integrated circuit according to the present invention. This semiconductor integrated circuit is formed on a silicon substrate as FCRAM (Fast Cycle RAM) of a clock synchronous type, by using a CMOS process. The FCRAM is the memory which divides its internal operation into three stages and self-completes the operations of the respective stages. Namely, the FCRAM executes pipeline processing of receiving operation of an address and operation of a memory core, as well as input/output of data, thereby shortening random access cycle. Since the FCRAM includes volatile memory cells (DRAM memory cells comprised of capacitors), it is necessary to perform refresh operation for rewriting data which is held in the memory cells. In this embodiment, the refresh operation is performed according to a refresh request which is automatically generated inside the FCRAM. The refresh request is generated not only during a standby mode but also during the execution of read operation and write operation. Therefore, it is not necessary for a system to which the FCRAM is mounted, to control the refresh.

The FCRAM includes a clock buffer 10, a command buffer 12, an external command receiving circuit 14, a refresh timer 16, an internal command receiving circuit 18, a control circuit 20 and a memory array (memory core) 22.

The clock buffer 10 receives a clock signal CLK (a first clock signal) which is supplied from the exterior of the FCRAM, and outputs the received signal as an internal clock signal ICLK. The command buffer 12 receives a command signal CMD (an external command signal) which is supplied from the exterior, and generates a read command signal RDC, a write command signal WRC or the like according to a combination of the received signals. The command signal CMD is the control signal for performing the read operation or the write operation of the memory array 22. The external command receiving circuit 14 latches the read command signal RDC or the write command signal WRC in synchronization with a rising edge of the internal clock signal ICLK, and outputs the latched signal as a read pulse RDP or a write pulse WRP. In general, the command signal CMD is received in synchronization with a rising edge of the clock signal CLK. Therefore, it is possible to design the receiving circuit of the command signal CMD in the same logic as that of the conventional art.

The refresh timer 16 has an oscillator being embedded therein, and generates a refresh requesting signal REFRQ (internal command signal) at predetermined intervals. The internal command receiving circuit 18 latches the refresh requesting signal REFRQ in synchronization with a falling edge of the internal clock signal ICLK, and outputs the latched signal as a refresh pulse REFP. In actuality, the internal command receiving circuit 18 has an inverter 18*a* (a phase inverting circuit) which inverts the phase of the internal clock signal ICLK, and latches the refresh requesting signal REFRQ in synchronization with a rising edge of an internal clock signal/CLK (a second clock signal) which is outputted from the inverter 18*a*.

The control circuit 20 includes a decision circuit 20*a* for deciding on which of the read pulse RDP, the write pulse WRP, and the refresh pulse REFP is the first arrival. According to the first arriving pulse which is decided by the decision circuit 20*a*, the control circuit 20 outputs a control signal CNT which operates the memory array 22. The control circuit 20 includes a holding circuit (not shown) for holding information about the pulses which are decided as not first by the decision circuit 20*a*. After completing the operation of the memory array 22 according to the first arriving pulse, the control circuit 20 operates the memory array 22 according to the information held in the holding circuit. The generation of the read pulse RDP, the write pulse WRP and the refresh pulse REFP shifts from one another by at least a half cycle of the clock signal CLK. Hence, the decision circuit 20*a* can easily decide the first arrival among the pulses. In other words, receiving the command signal CMD and the refresh requesting signal REFRQ at different timings which shift from each other by a half clock makes it possible to increase an operation margin of the control circuit 20.

The memory array 22 includes a plurality of memory cells, sense amplifiers and so on, which are not shown in the drawing. The memory array 22 performs the read operation for reading the data which is held in the memory cells, the write operation for writing data in the memory cells, or the refresh operation for rewriting the data which is held in the memory cells, according to the control signal CNT. Namely, the memory array 22 operates as an internal circuit according to the external command signal and the internal command signal.

Figure 3:
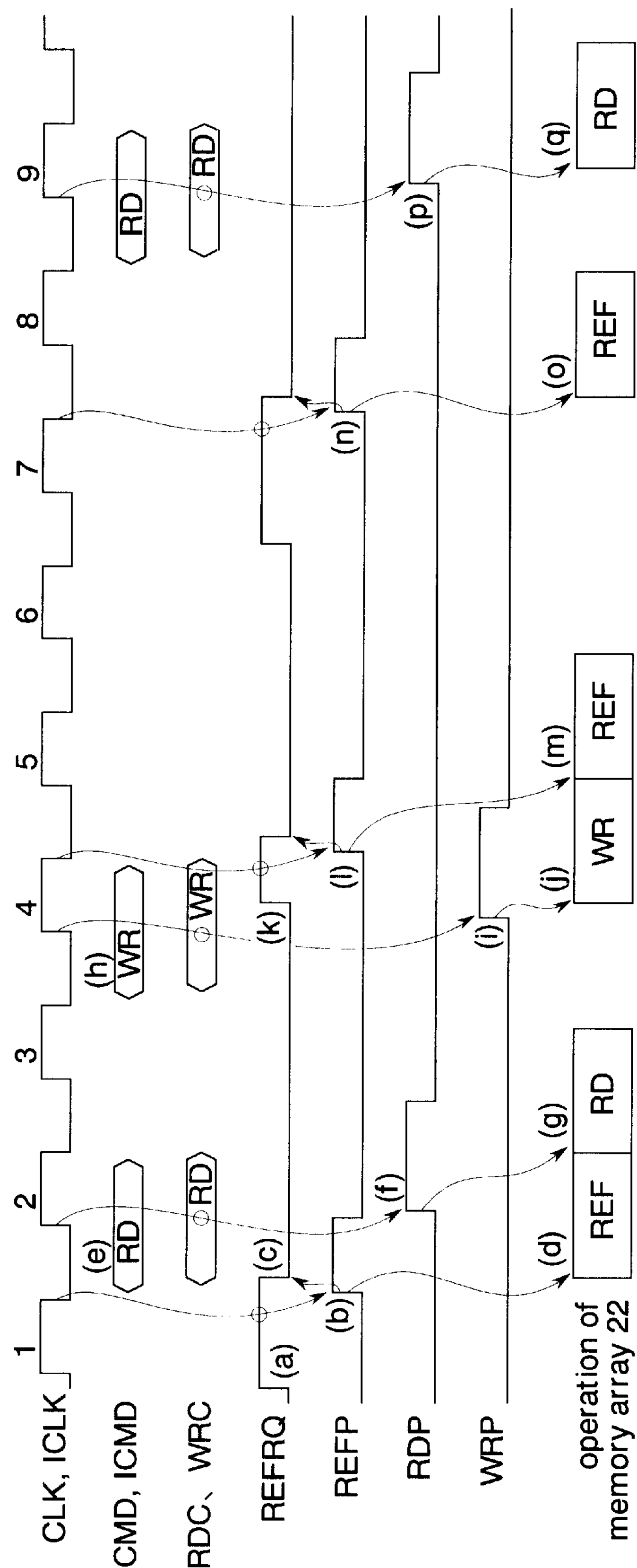
FIG. 3 is a timing chart showing the operation of FCRAM shown in FIG. 2.

FIG. 3 shows the operation of the above-described FCRAM.

First, in this example, the refresh timer 16 shown in FIG. 2 generates the refresh requesting signal REFRQ (FIG. 3(*a*)). The internal command receiving circuit 18 latches the refresh requesting signal REFRQ in synchronization with the falling edge of the first internal clock signal ICLK, and generates the refresh pulse REFP (FIG. 3(*b*)). The refresh requesting signal REFRQ is reset by the generation of the refresh pulse REFP (FIG. 3(*c*)).

When the refresh pulse REFP is generated, the memory array 22 is not operating. Hence, the decision circuit 20*a* shown in FIG. 2 decides that the refresh pulse REFP is the first arrival. The control circuit 20 controls the memory array 22 and starts the refresh operation REF of the memory cells (FIG. 3(*d*)).

The command signal CMD is supplied to the SDRAM in synchronization with the second clock signal CLK. The command buffer 12 decodes the command signal CMD, and outputs the read command RD as the internal command signal ICMD (FIG. 3(*e*)). The external command receiving circuit 14 latches the read command RD in synchronization with the rising edge of the internal clock signal ICLK, and outputs it as the read pulse RDP (FIG. 3(*f*)). The refresh operation REF is being performed at this point, and hence the decision circuit 20*a* decides that the read pulse RDP is not the first arrival. The read pulse RDP is held in the holding circuit until the refresh operation REF is completed. After the refresh operation REF is completed, the control circuit 20 performs the read operation RD (FIG. 3(*g*)).

The command signal CMD is supplied to the SDRAM in synchronization with the fourth clock signal CLK. The command buffer 12 decodes the command signal CMD, and outputs the write command WR as the internal command signal ICMD (FIG. 3(*h*)). The external command receiving circuit 14 latches the write command WR in synchronization with the rising edge of the internal clock signal ICLK, and outputs it as the write pulse WRP (FIG. 3(*i*)). When the write pulse WRP is generated, the memory array 22 is not operating. Hence, the decision circuit 20*a* decides that the write pulse WRP is the first arrival. The control circuit 20 controls the memory array 22 and starts the write operation WR (FIG. 3(*j*)).

Thereafter, the refresh timer 16 generates the refresh requesting signal REFRQ (FIG. 3(*k*)). The internal command receiving circuit 18 latches the refresh requesting signal REFRQ in synchronization with the falling edge of the fourth internal clock signal ICLK, and generates the refresh pulse REFP (FIG. 3(*l*)). The write operation WR is being performed at this point, and hence the decision circuit 20*a* decides that the refresh pulse REFP is not the first arrival. The refresh pulse REFP is held in the holding circuit until the write operation WR is completed. After the write operation WR is completed, the control circuit 20 performs the refresh operation REF (FIG. 3(*m*)).

The refresh timer 16 generates the refresh requesting signal REFRQ again, and the refresh requesting signal REFRQ is generated (FIG. 3(*n*)). When the refresh pulse REFP is generated, the memory array 22 is not operating. Hence, the control circuit 20 decides that the refresh pulse REFP is the first arrival, and performs the refresh operation REF of the memory cells (FIG. 3(*o*)).

The read command RD is supplied in synchronization with the ninth clock signal CLK, and the read pulse RDP is generated (FIG. 3(*p*)). When the read pulse RDP is generated, the memory array 22 is not operating. Hence, the control circuit 20 decides that the read pulse RDP is the first arrival, and performs the read operation RD (FIG. 3(*q*)).

Thus, the internal operation according to the external command signal (the read operation RD and the write operation WR) and the internal operation according to the internal command signal (the refresh operation REF) are performed without a malfunction.

As described above, according to the present invention, receiving operation of the refresh requesting signal REFRQ by the internal command receiving circuit 18 shifts from receiving operation of the command signal CMD by the external command receiving circuit 14 by a half cycle of the clock signal CLK. As a result of this, it is possible to prevent conflict between the operation of the memory array 22 according to the command signal CMD and the operation of the memory array 22 according to the refresh requesting signal REFRQ, and to prevent the malfunction.

The control circuit 20 does not receive the refresh pulse REFP immediately after it starts the read operation RD or the write operation WR according to the command signal CMD. Hence, it is possible to enhance an operation margin of the control circuit 20. Therefore, the control circuit 20 can operate the memory array 22 without the malfunction.

The external command receiving circuit 14 receives the command signal CMD (the read command signal RDC or the write command signal WRC) in synchronization with the rising edge of the clock signal CLK (the internal clock signal ICLK), similarly to the conventional art. Therefore, it is possible to design the receiving circuit of the command signal CMD in the same logic as that of the conventional art, and to improve its design efficiency.

The inverter 18*a* (the phase inverting circuit) for inverting the phase of the internal clock signal ICLK to generate the internal clock signal/ICLK is formed inside the internal command receiving circuit 18. Thereby, the receiving timing of the command signal CMD can shift from the receiving timing of the refresh requesting signal REFRQ by at least a half clock, by the simple circuit. Namely, the receiving timing of the refresh requesting signal REFRQ shifts from the receiving timing of the command signal CMD (the rising edge of the clock signal CLK) by a predetermined time.

Since the receiving timing of the command signal CMD always shifts from the receiving timing of the refresh requesting signal REFRQ by a predetermined time, deciding on which one of the command signal CMD and the refresh requesting signal REFRQ is the first arrival can be made by the simple decision circuit 20*a*. Therefore, the control circuit 20 can securely operate the memory array 22 without malfunction.

The present invention is applied to the FCRAM which includes the memory cells of the DRAM and automatically generates the refresh request in its interior. Since the receiving timing of the command signal CMD supplied from the exterior shifts from the receiving timing of the refresh requesting signal REFRQ generated in its interior, the control circuit 20 does not receive the refresh requesting signal REFRQ (the refresh pulse REFP) immediately after it starts the read operation RD or the write operation WR according to the command signal CMD. Therefore, the read operation RD, the write operation WR and the refresh operation REF are not performed simultaneously with each other because of the malfunction of the control circuit 20, and therefore, it is possible to prevent the data in the memory cells from being destroyed.

Even when the refresh requesting signal REFRQ is generated asynchronously to the clock signal CLK, it is possible to prevent the conflict of the read operation RD, the write operation WR, and the refresh operation REF.

Figure 4:
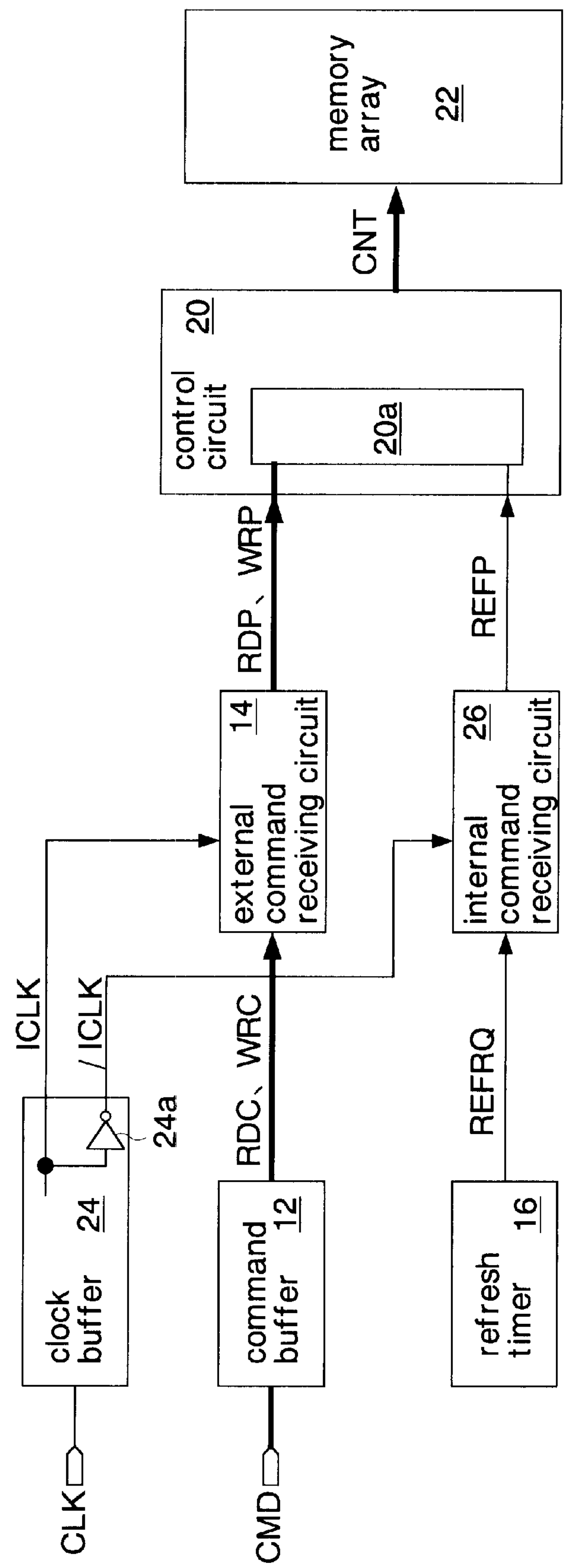
FIG. 4 is a block diagram showing a second embodiment of the semiconductor integrated circuit according to the present invention.

FIG. 4 shows a second embodiment of the semiconductor integrated circuit according to the present invention. The same numerals and symbols are given to designate the same circuits and signals as those in the first embodiment, and detailed explanations thereof will be omitted. Similarly to the first embodiment, the semiconductor integrated circuit is formed on the silicon substrate as the FCRAM (Fast Cycle RAM) of the clock synchronous type, by using the CMOS process.

The FCRAM includes a clock buffer 24 (a clock generator) and an internal command receiving circuit 26, instead of the clock buffer 10 and the internal command receiving circuit 18 according to the first embodiment. The clock buffer 24 receives a clock signal CLK (a first clock signal) which is supplied from the exterior of the FCRAM, and outputs the received signal as an interior clock signal ICLK (a first clock signal) and an internal clock signal/ICLK (a second clock signal). The phase of the internal clock signal ICLK is inverted through an inverter 24*a* (a phase inverting circuit) to become the internal clock signal/ICLK. The internal command receiving circuit 26 receives a refresh requesting signal REFRQ in synchronization with a rising edge of the internal clock signal/ICLK, and outputs the received signal as a refresh pulse REFP. The rest of the structure is the same as that of the above-described first embodiment.

Figure 5:
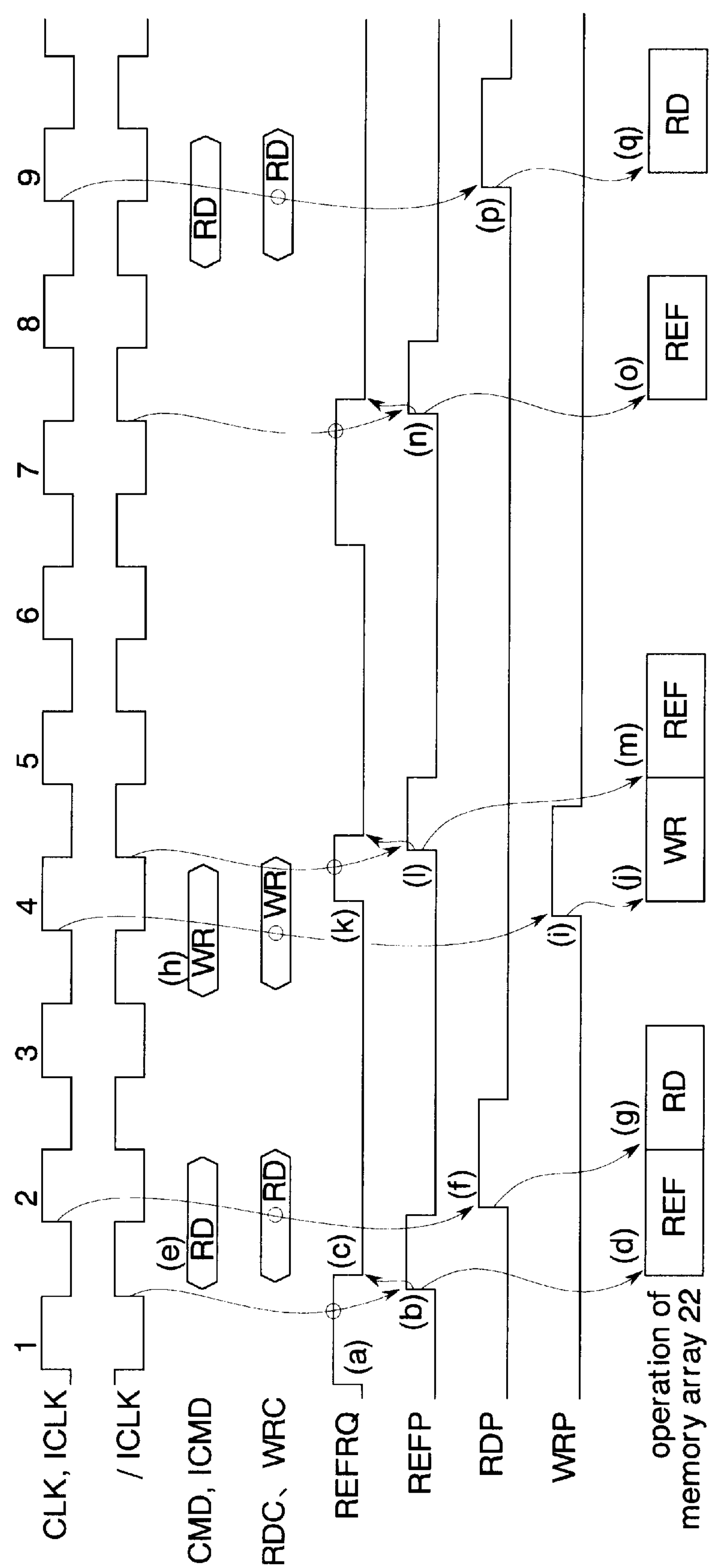
FIG. 5 is a timing chart showing the operation of the FCRAM shown in FIG. 4.

FIG. 5 shows the operation of the above-described FCRAM. In this embodiment, the internal command receiving circuit 26 latches the refresh requesting signals REFRQ in synchronization with the rising edges of the internal clock signals /ICLK, and generates the refresh pulses REFP (FIG. 5(*b*), (*l*), (*n*)). Since its basic operation is the same as that shown in FIG. 3, detailed explanation will be omitted. (*a*) to (*q*) which are added to the waveforms in FIG. 5 correspond to (*a*) to (*q*) in FIG. 3, respectively.

The same effects as those in the aforementioned first embodiment can be obtained in this embodiment as well. Further, in this embodiment, the receiving operation of the command signal CMD by the external command receiving circuit 14 shifts from the receiving operation of the refresh requesting signal REFRQ by the internal command receiving circuit 26 by a phase difference between the internal clock signal ICLK and the internal clock signal /ICLK. As a result of this, it is possible to prevent the conflict in the operation of the memory array 22 according to the command signal CMD and the operation of the memory array 22 according to the refresh requesting signal REFRQ, and to prevent the malfunction.

The inverter 24*a* (the phase inverting circuit) for inverting the phase of the internal clock signal ICLK to generate the internal clock signal /ICLK is formed inside the clock buffer 24. Thereby, the receiving timing of the command signal CMD can shift from the receiving timing of the refresh requesting signal REFRQ by the simple circuit.

Figure 6:
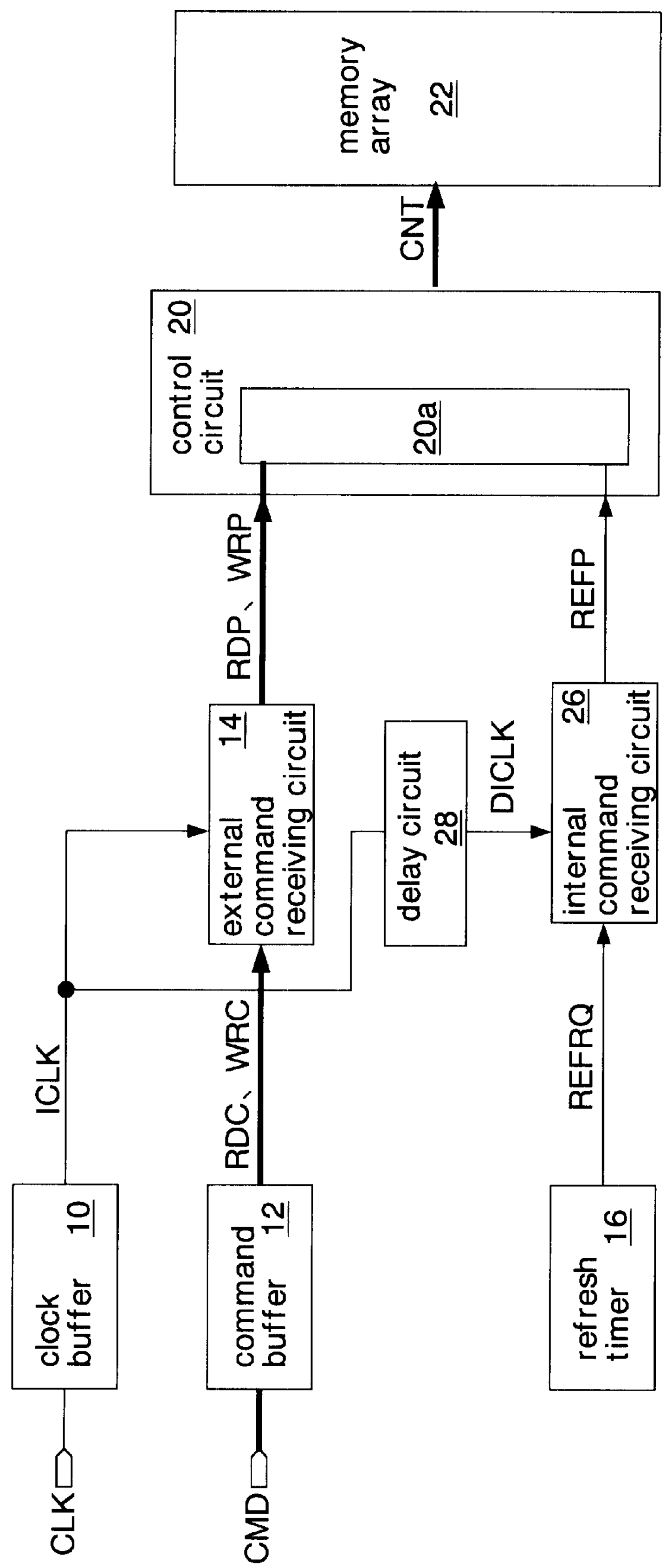
FIG. 6 is a block diagram showing a third embodiment of the semiconductor integrated circuit according to the present invention.

FIG. 6 shows a third embodiment of the semiconductor integrated circuit according to the present invention. The same numerals and symbols are given to designate the same circuits and signals as those in the first and the second embodiments, and detailed explanations thereof will be omitted. Similarly to the first embodiment, the semiconductor integrated circuit is formed on the silicon substrate as the FCRAM (Fast Cycle RAM) of the clock synchronous type, by using the CMOS process.

The FCRAM includes a delay circuit 28 (a clock generator) which delays an internal clock signal ICLK (a first clock signal) for a predetermined time to generate a delay clock signal DICLK (a second clock signal). An internal command receiving circuit 26 receives a refresh requesting signal REFRQ in synchronization with a rising edge of the delay clock signal DICLK, and outputs the received signal as a refresh pulse REFP. The rest of the structure is the same as that of the above-described first embodiment.

Figure 7:
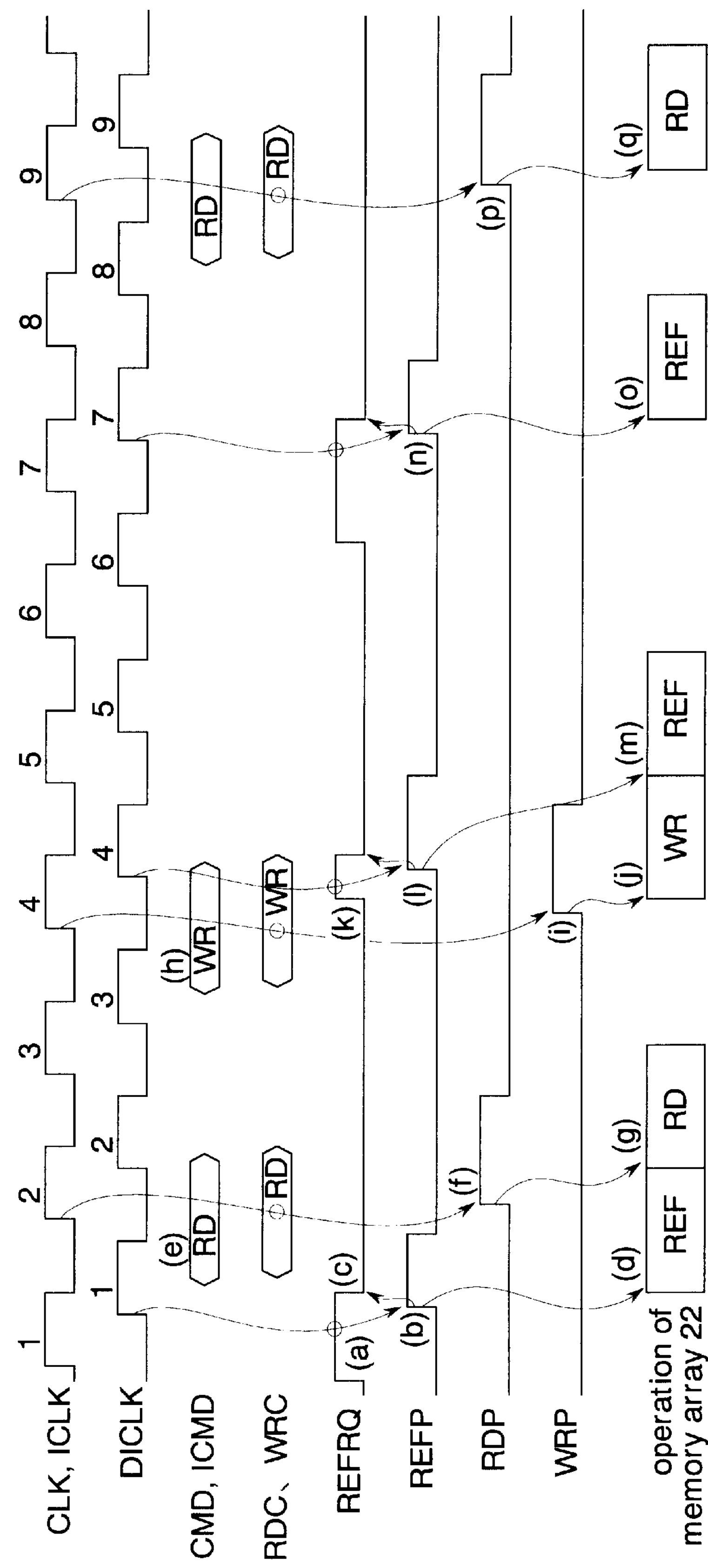
FIG. 7 is a timing chart showing the operation of the FCRAM shown in FIG. 6.

FIG. 7 shows the operation of the above-described FCRAM. In this embodiment, the internal command receiving circuit 26 latches the refresh requesting signals REFRQ in synchronization with the rising edges of the delay clock signals DICLK, and generates the refresh pulses REFP (FIG. 7(*b*), (*l*), (*n*)). Since its basic operation is the same as that shown in FIG. 3, detailed explanation will be omitted. (*a*) to (*q*) which are added to the waveforms in FIG. 7 correspond to (*a*) to (*q*) in FIG. 3, respectively.

The same effects as those in the aforementioned first and second embodiments can be obtained in this embodiment as well. Further, in this embodiment, just forming the simple delay circuit 28 (the clock generator) makes it realize to shift the receiving timing of the command signal CMD from the receiving timing of the refresh requesting signal REFRQ.

It should be noted that, in the aforementioned embodiments, the example of applying the present invention to the FCRAM is explained. The present invention is not limited to the above embodiments. For example, the present invention may be applied to SDRAM. It may also be applied to a logic LSI such as a microcomputer.

The invention is not limited to the above embodiments and various modifications may be made without departing from the spirit and the scope of the invention. Any improvement may be made in part or all of the components.

What is claimed is:

1. A semiconductor integrated circuit comprising:

an external command receiving circuit for receiving an external command signal supplied from the exterior of the integrated circuit, in synchronization with one transition edge of a first clock signal supplied from said exterior;

an internal command receiving circuit for receiving an internal command signal internally generated, in synchronization with the other transition edge of said first clock signal; and a control circuit for operating an internal circuit according to said external command signal received in said external command receiving circuit or said internal command signal received in said internal command receiving circuit.

2. The semiconductor integrated circuit according to claim 1, wherein:

said external command receiving circuit receives said external command signal in synchronization with a rising edge of said first clock signal; and said internal command receiving circuit receives said internal command signal in synchronization with a falling edge of said first clock signal.

3. The semiconductor integrated circuit according to claim 2, wherein said internal command receiving circuit has a phase inverting circuit for inverting the phase of said first clock signal to generate a second clock signal, and receives said internal command signal in synchronization with a rising edge of said second clock signal.

4. The semiconductor integrated circuit according to claim 1, wherein said control circuit has a decision circuit for deciding a first command signal which is received first between said external command signal received in said external command receiving circuit and said internal command signal received in said internal command receiving circuit, and for operating said internal circuit according to said first command signal.

5. The semiconductor integrated circuit according to claim 1, wherein:

said internal circuit has a memory array including volatile memory cells;

said external command signal is a control signal for performing either one of read operation and write operation of said memory cells; and said internal command signal is a refresh requesting signal for rewriting data held in said the memory cells.

6. The semiconductor integrated circuit according to claim 1, further comprising:

a timer for generating said internal command signal at predetermined intervals.

7. A semiconductor integrated circuit comprising:

an external command receiving circuit for receiving an external command signal, supplied from the exterior of the integrated circuit, in synchronization with a first clock signal supplied from said exterior;

a clock generator for converting said first clock signal to a second clock signal whose phase is different from that of the first clock signal;

an internal command receiving circuit for receiving an internal command signal internally generated, in synchronization with said second clock signal; and a control circuit for operating an internal circuit according to said external command signal received in said external command receiving circuit or said internal command signal received in said internal command receiving circuit.

8. The semiconductor integrated circuit according to claim 7, wherein said clock generator has a phase inverting circuit for inverting the phase of said first clock signal to generate said second clock signal.

9. The semiconductor integrated circuit according to claim 7, wherein said clock generator has a delay circuit for delaying said first clock signal to generate said second clock signal.

10. The semiconductor integrated circuit according to claim 7, wherein said control circuit has a decision circuit for deciding a first command signal which is received first between said external command signal received in said external command receiving circuit and said internal command signal received in said internal command receiving circuit, and for operating said internal circuit according to said first command signal.

11. The semiconductor integrated circuit according to claim 7, wherein:

said internal circuit has a memory array including volatile memory cells;

said external command signal is a control signal for performing either one of read operation and write operation of said memory cells; and said internal command signal is a refresh requesting signal for rewriting data held in said the memory cells.

12. The semiconductor integrated circuit according to claim 7, further comprising:

a timer for generating said internal command signal at predetermined intervals.

* * * * *